(12) United States Patent
Hong et al.

(10) Patent No.: US 11,538,967 B2
(45) Date of Patent: Dec. 27, 2022

(54) DISPLAY DEVICE WITH A BEZEL KIT

(71) Applicant: LG ELECTRONICS INC., Seoul (KR)

(72) Inventors: Daewoon Hong, Seoul (KR); Sangtae Park, Seoul (KR); Myeongwook Bae, Seoul (KR); Jeongsik Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/650,368

(22) PCT Filed: Feb. 26, 2018

(86) PCT No.: PCT/KR2018/002332
§ 371 (c)(1),
(2) Date: Mar. 24, 2020

(87) PCT Pub. No.: WO2019/059471
PCT Pub. Date: Mar. 28, 2019

(65) Prior Publication Data
US 2020/0235270 A1 Jul. 23, 2020

(30) Foreign Application Priority Data
Sep. 25, 2017 (KR) .......................... 10-2017-0123632

(51) Int. Cl.
*H01L 29/20* (2006.01)
*H01L 33/00* (2010.01)
(Continued)

(52) U.S. Cl.
CPC .......... *H01L 33/58* (2013.01); *H01L 23/5387* (2013.01); *H01L 25/0753* (2013.01);
(Continued)

(58) Field of Classification Search
CPC . H01L 33/58; H01L 23/5387; H01L 25/0753; H01L 25/167; H01L 33/62; H01L 2933/0091; H01L 2933/0066
See application file for complete search history.

(56) References Cited

U.S. PATENT DOCUMENTS 7,780,306 B2 * 8/2010 Hoshi .................. G02B 6/0036
362/97.1
7,909,496 B2 * 3/2011 Matheson ............ G02B 6/0041
362/609
(Continued)

FOREIGN PATENT DOCUMENTS

JP 2009-043628 2/2009
KR 2011-0009962 1/2011
(Continued)

OTHER PUBLICATIONS

PCT International Application No. PCT/KR2018/002332, International Search Report dated Jun. 22, 2018, 3 pages.

*Primary Examiner* — Ismail A Muse
(74) *Attorney, Agent, or Firm* — Lee, Hong, Degerman, Kang & Waimey PC

(57) ABSTRACT

Disclosed is a display device. The display device includes: a light transmissive plate including a first front surface, a rear surface facing the first front surface, and a hole positioned behind the first front surface and connected to the rear surface; and a display film attached to the rear surface of the plate, in which the display film includes a light transmissive substrate having a second front surface attached to the plate, an electrode layer formed on the second front surface, and a light source electrically connected to the electrode layer, and the light source is positioned in the hole.

13 Claims, 12 Drawing Sheets

(51) Int. Cl.
  *H01L 33/58* (2010.01)
  *H01L 23/538* (2006.01)
  *H01L 25/075* (2006.01)
  *H01L 25/16* (2006.01)
  *H01L 33/62* (2010.01)
(52) U.S. Cl.
  CPC ............ *H01L 25/167* (2013.01); *H01L 33/62* (2013.01); *H01L 2933/0091* (2013.01)

(56) References Cited

U.S. PATENT DOCUMENTS

| | | | | |
|---|---|---|---|---|
| 10,355,182 B2* | 7/2019 | Daeschner | ............... | H01L 33/54 |
| 10,700,044 B2* | 6/2020 | Shimizu | .............. | H01L 25/0753 |
| 2007/0139949 A1* | 6/2007 | Tanda | ....................... | F21V 9/38 |
| | | | | 362/551 |
| 2007/0215895 A1* | 9/2007 | Amoh | ..................... | H01L 33/60 |
| | | | | 257/99 |
| 2011/0249214 A1* | 10/2011 | Cheong | .................. | G02B 6/002 |
| | | | | 349/61 |
| 2012/0069579 A1* | 3/2012 | Koh | ..................... | G02B 6/0021 |
| | | | | 362/307 |
| 2013/0064260 A1* | 3/2013 | Tanda | ..................... | F21K 9/235 |
| | | | | 372/43.01 |
| 2014/0197441 A1* | 7/2014 | Ye | ........................... | F21V 29/85 |
| | | | | 257/98 |
| 2014/0284648 A1* | 9/2014 | Basin | .................. | H01L 33/0075 |
| | | | | 257/98 |
| 2015/0034987 A1* | 2/2015 | Hayashi | ................ | H01L 33/005 |
| | | | | 257/98 |
| 2016/0054486 A1* | 2/2016 | Isojima | ................ | G02B 5/0242 |
| | | | | 362/330 |
| 2016/0225963 A1* | 8/2016 | Yoshimura | ............ | H01L 33/504 |
| 2017/0279019 A1* | 9/2017 | Ueda | ....................... | H01L 33/38 |
| 2017/0365225 A1* | 12/2017 | Yoneyama | ........ | G02F 1/133605 |
| 2018/0097165 A1* | 4/2018 | Marutani | ............... | H01L 33/486 |
| 2018/0248093 A1* | 8/2018 | Chiu | ..................... | H01L 33/486 |
| 2021/0095833 A1* | 4/2021 | Lee | ............................ | F21V 9/30 |
| 2021/0111162 A1* | 4/2021 | Takeya | ............... | H01L 25/0753 |

FOREIGN PATENT DOCUMENTS

| KR | 2012-0074825 | 7/2012 |
|---|---|---|
| KR | 2014-0132965 | 11/2014 |
| KR | 101519331 | 5/2015 |

* cited by examiner

[Figure 1]
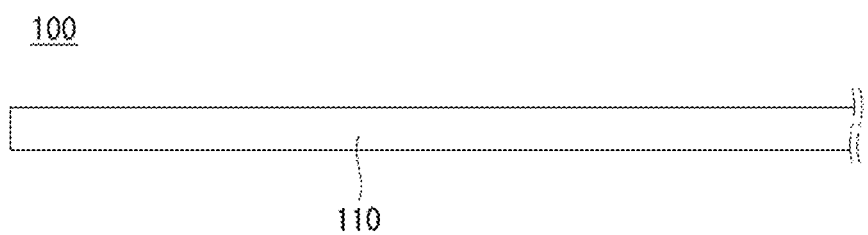
[Figure 2]
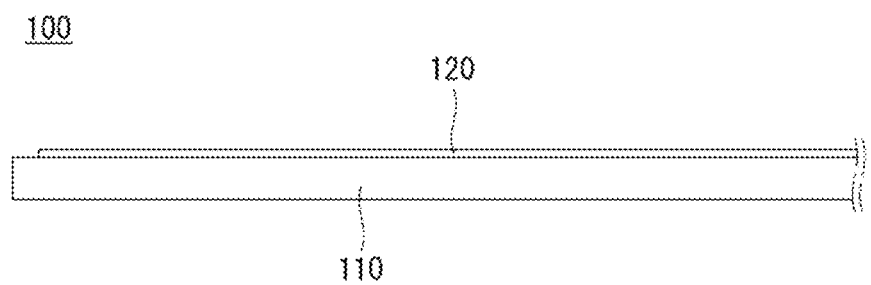
[Figure 3]
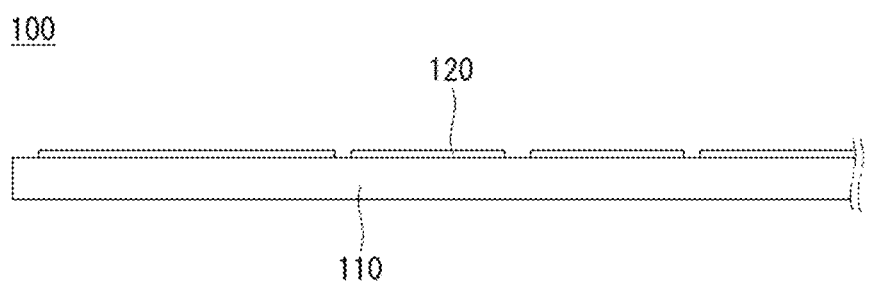

【Figure 4】
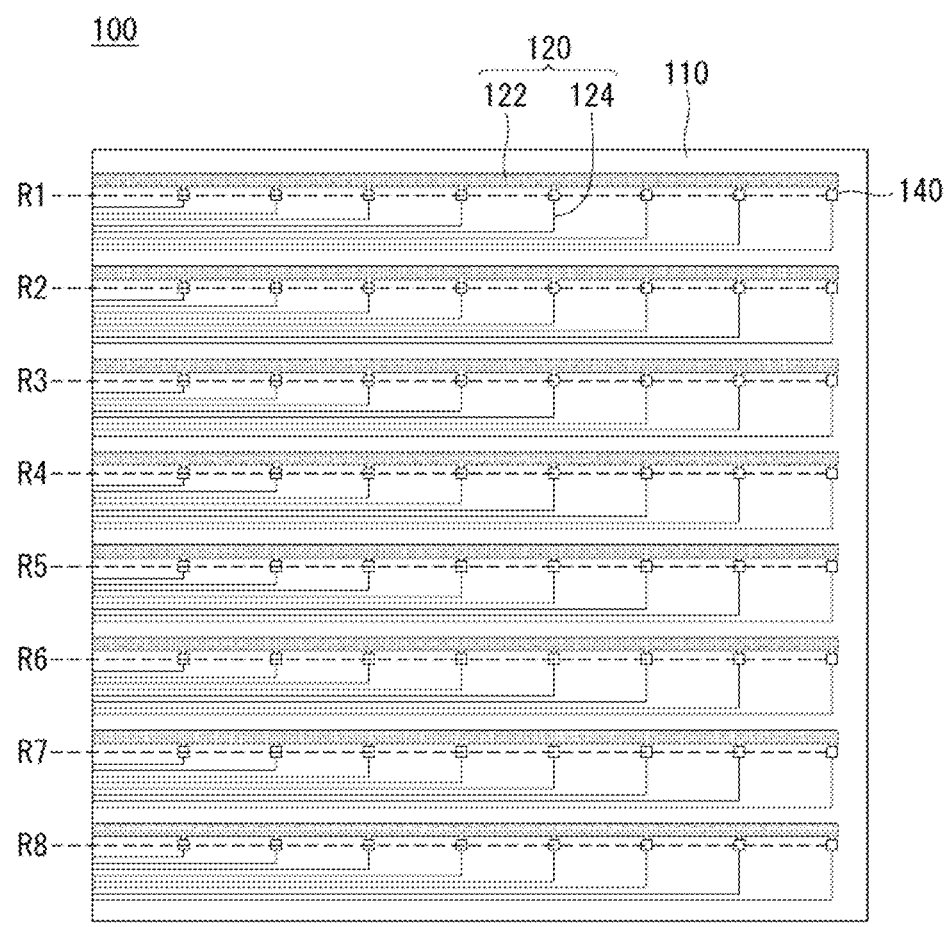

[Figure 5]
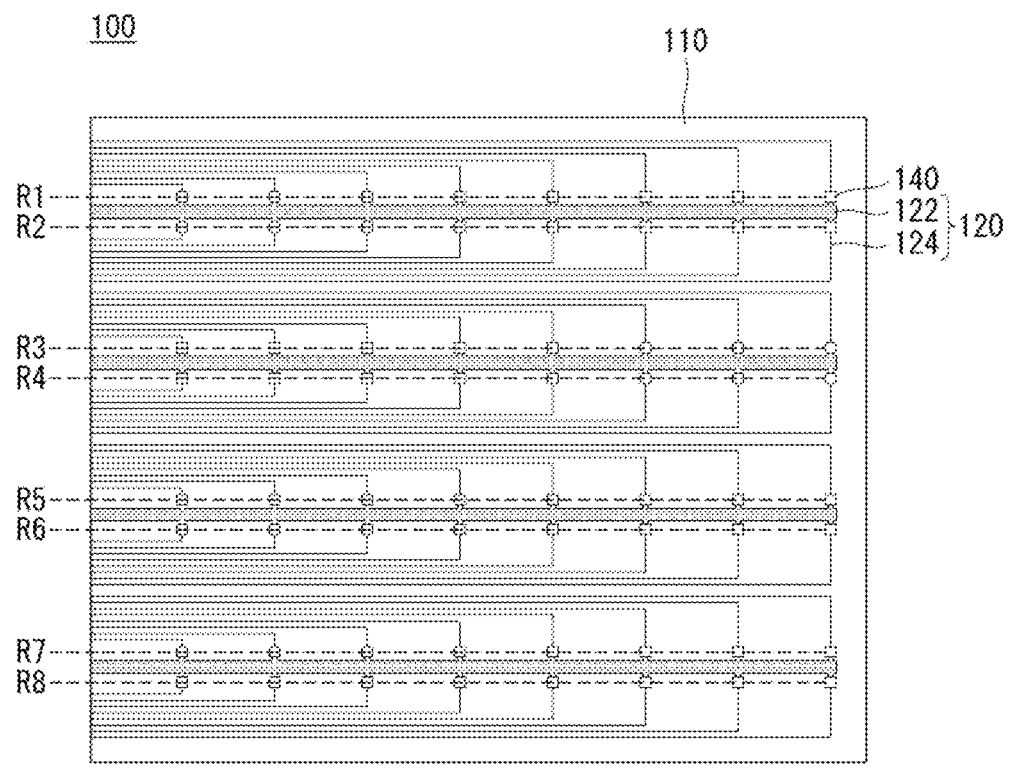
[Figure 6]
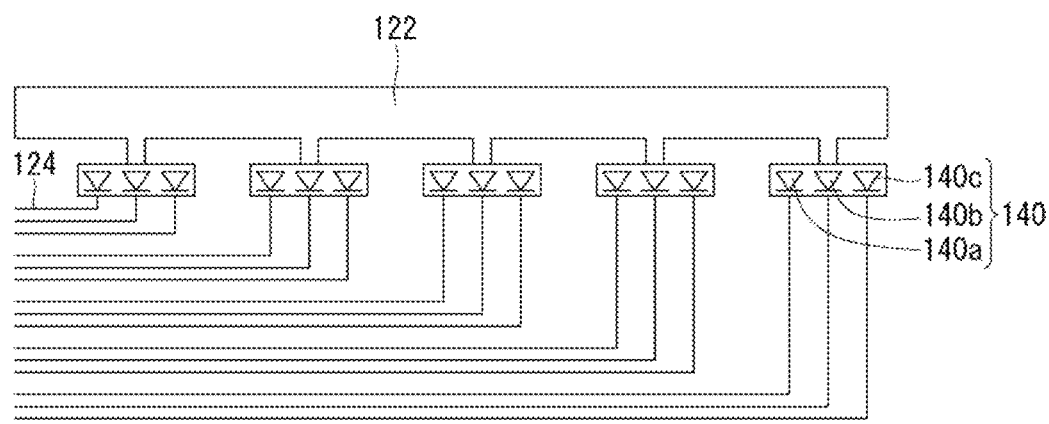

[Figure 7]
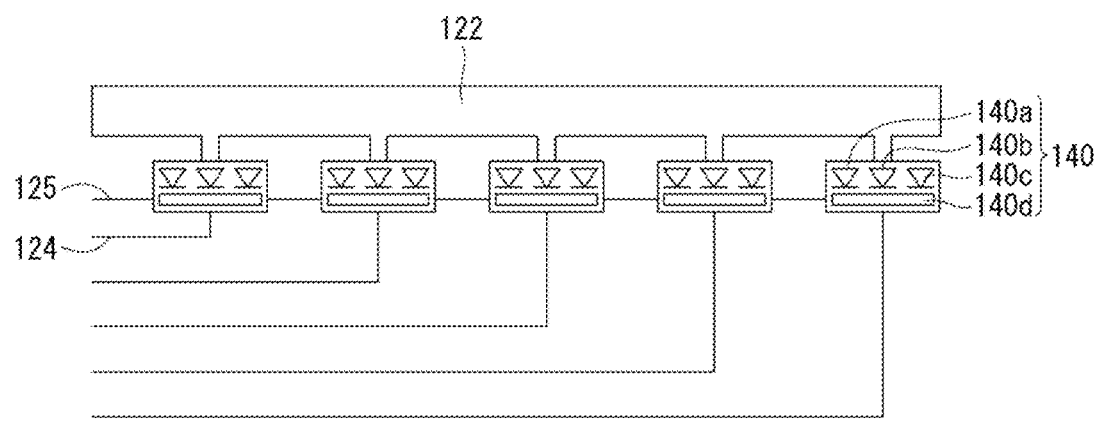
[Figure 8]
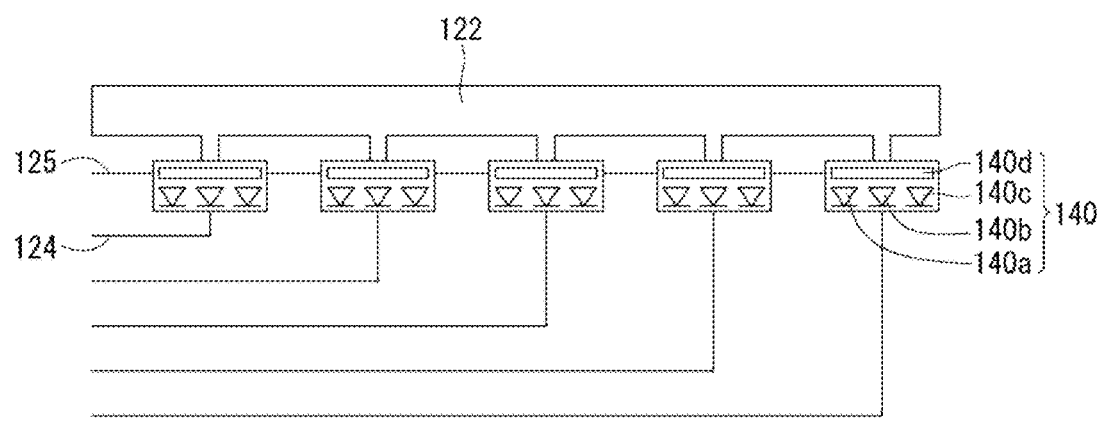

[Figure 9]
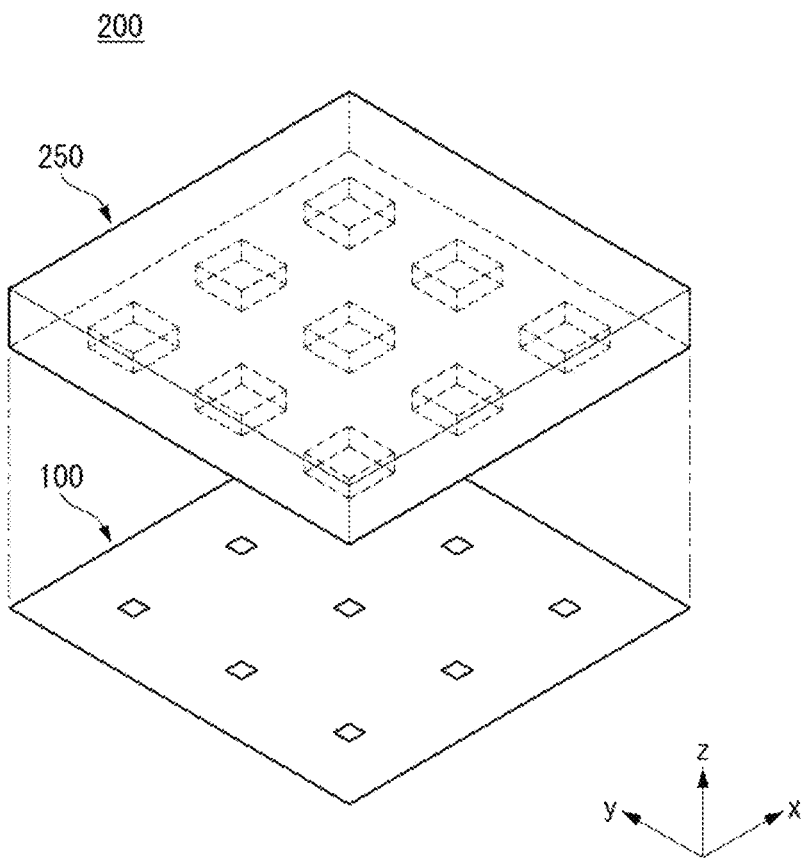
[Figure 10]
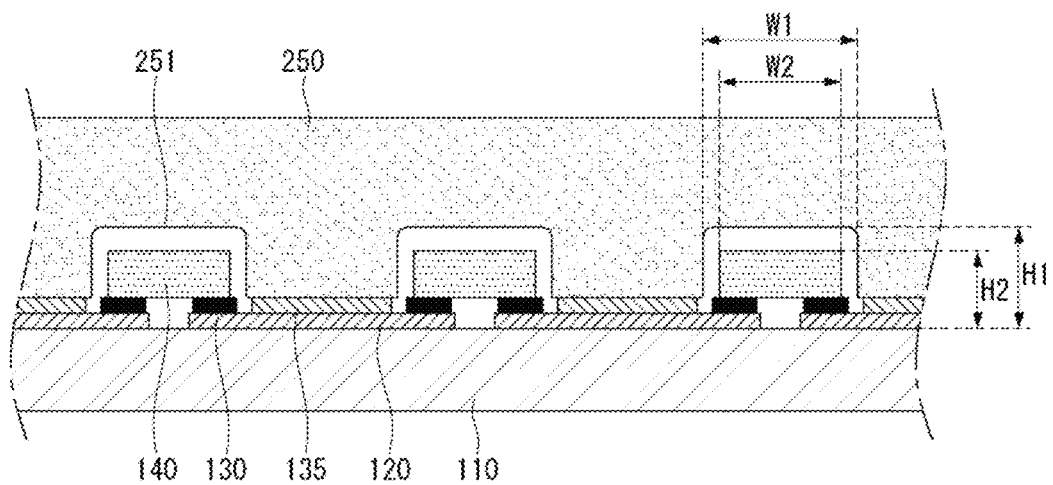

[Figure 11]
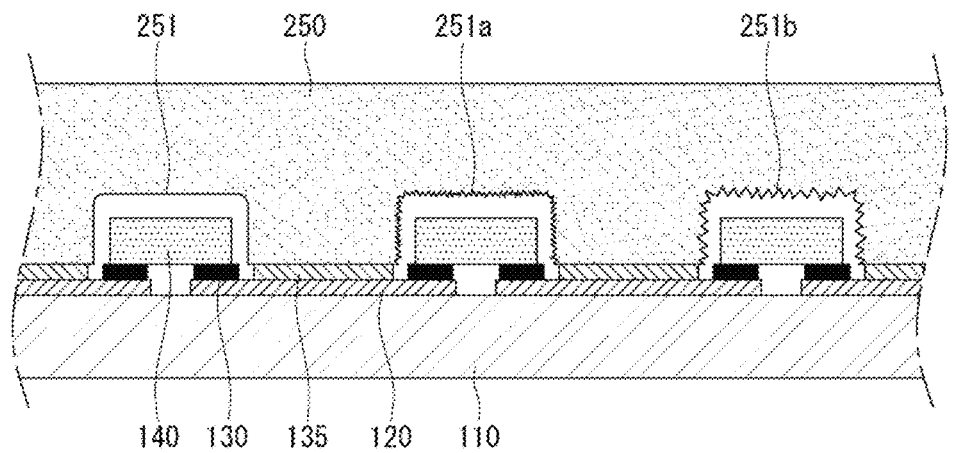
[Figure 12]
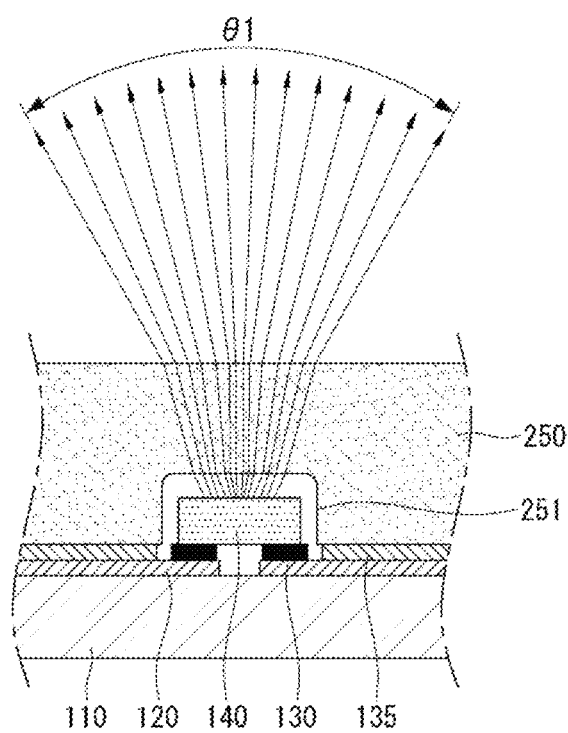

[Figure 13]
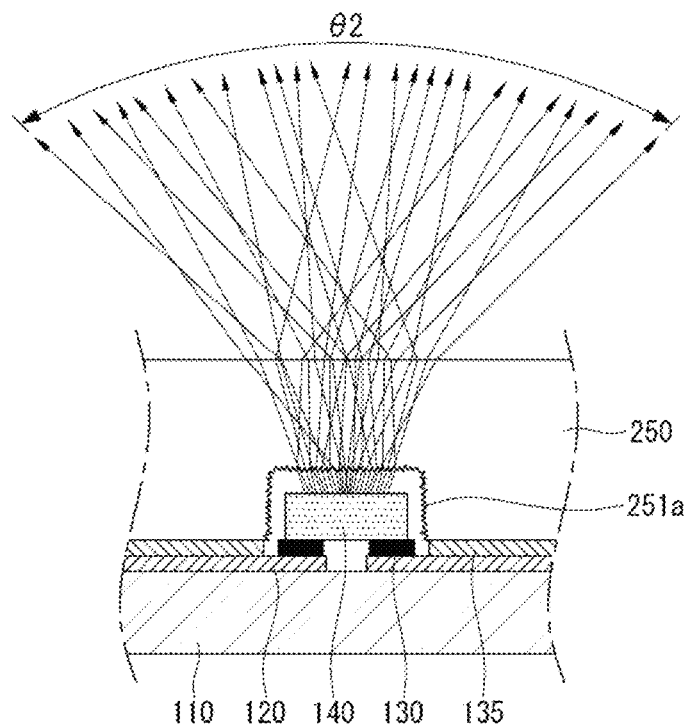
[Figure 14]
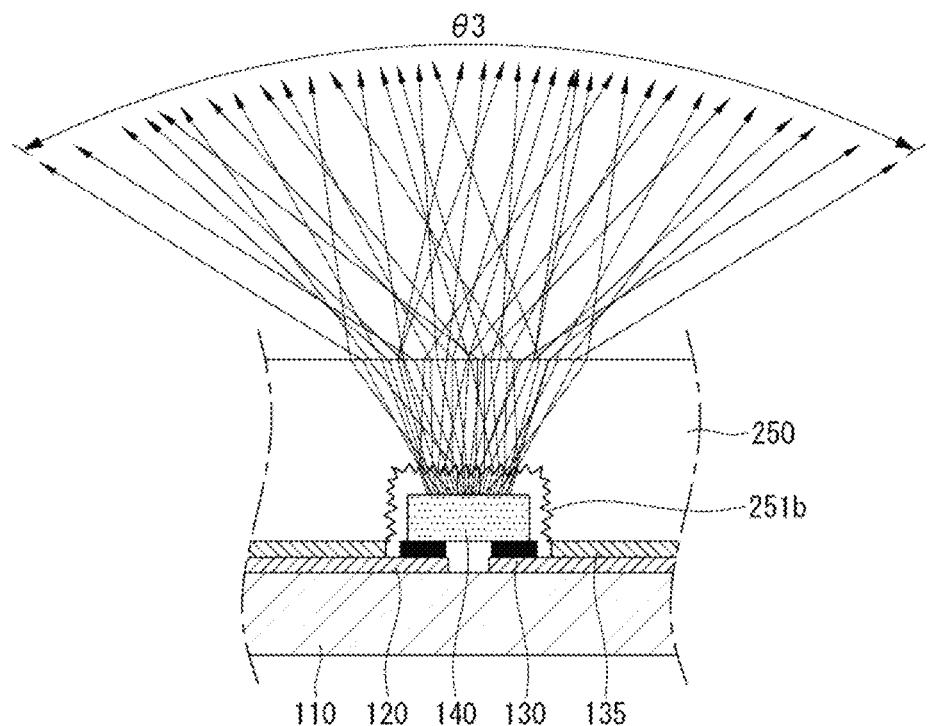

[Figure 15]
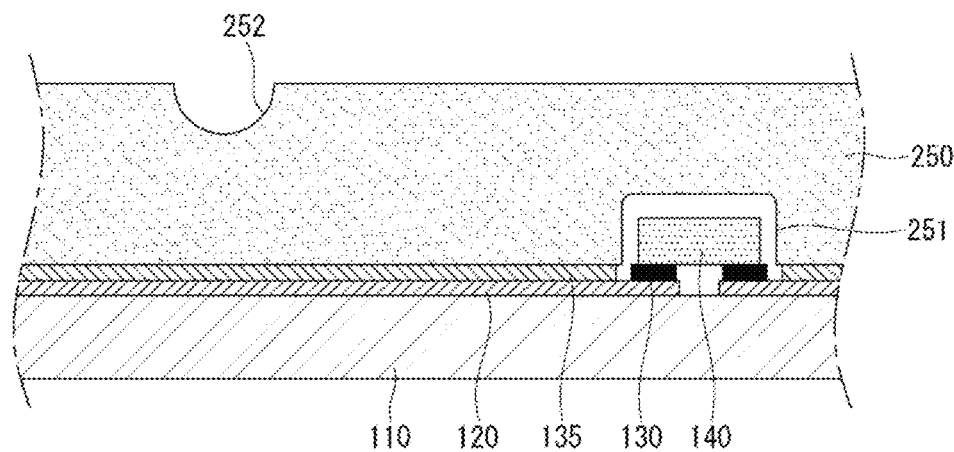
[Figure 16]
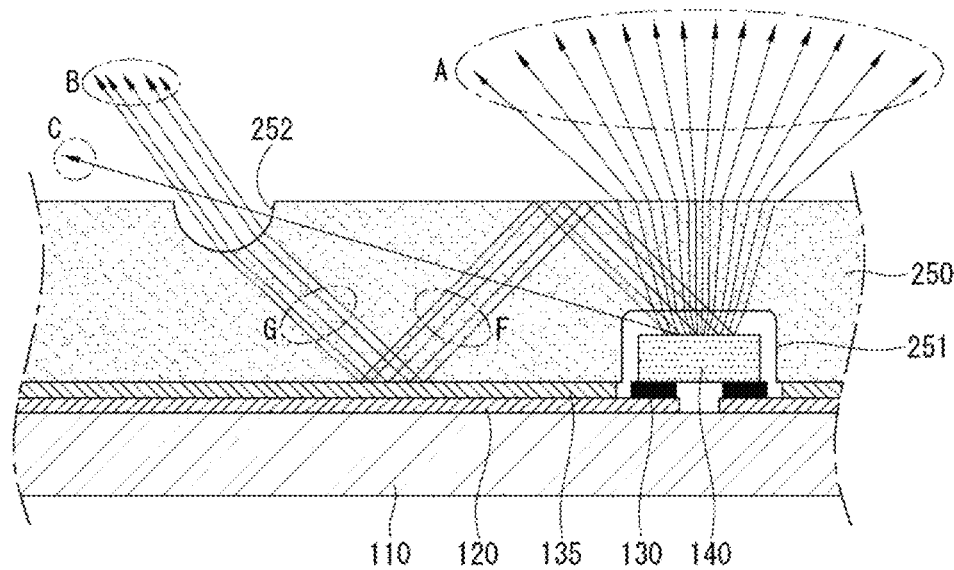

[Figure 17]
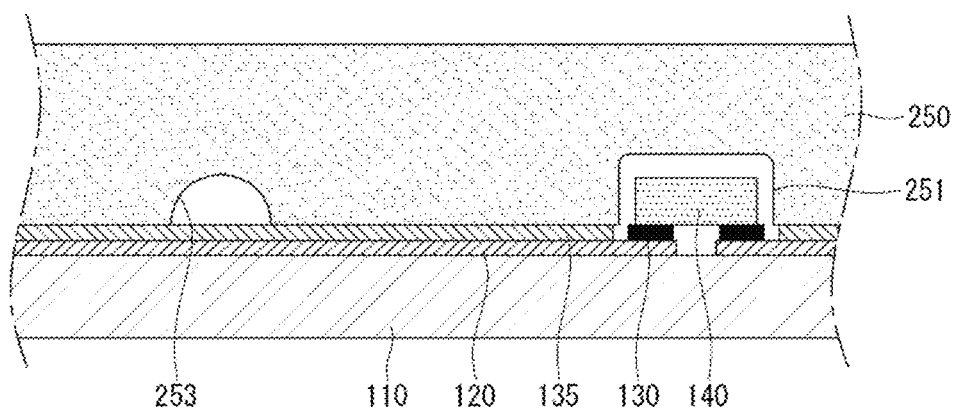
[Figure 18]
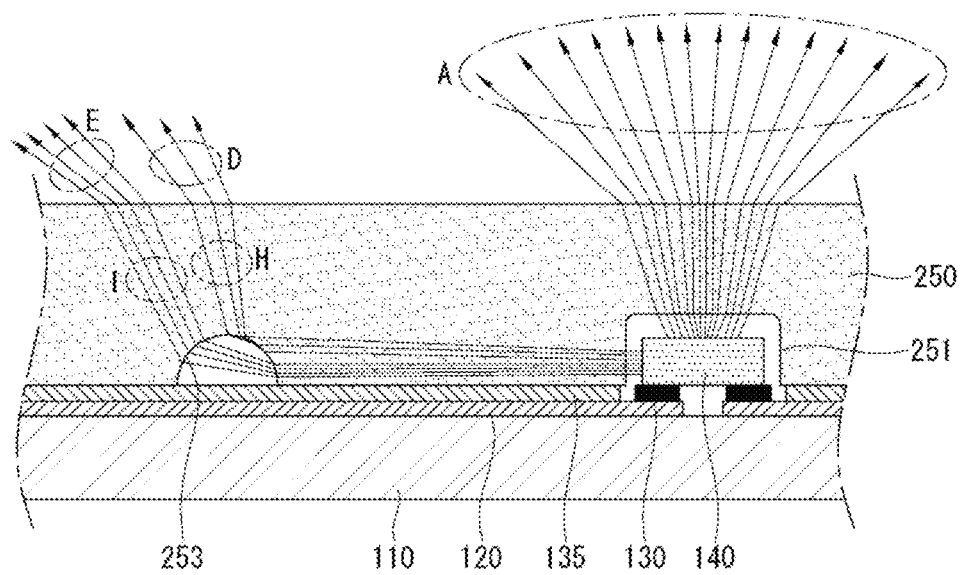

[Figure 19]
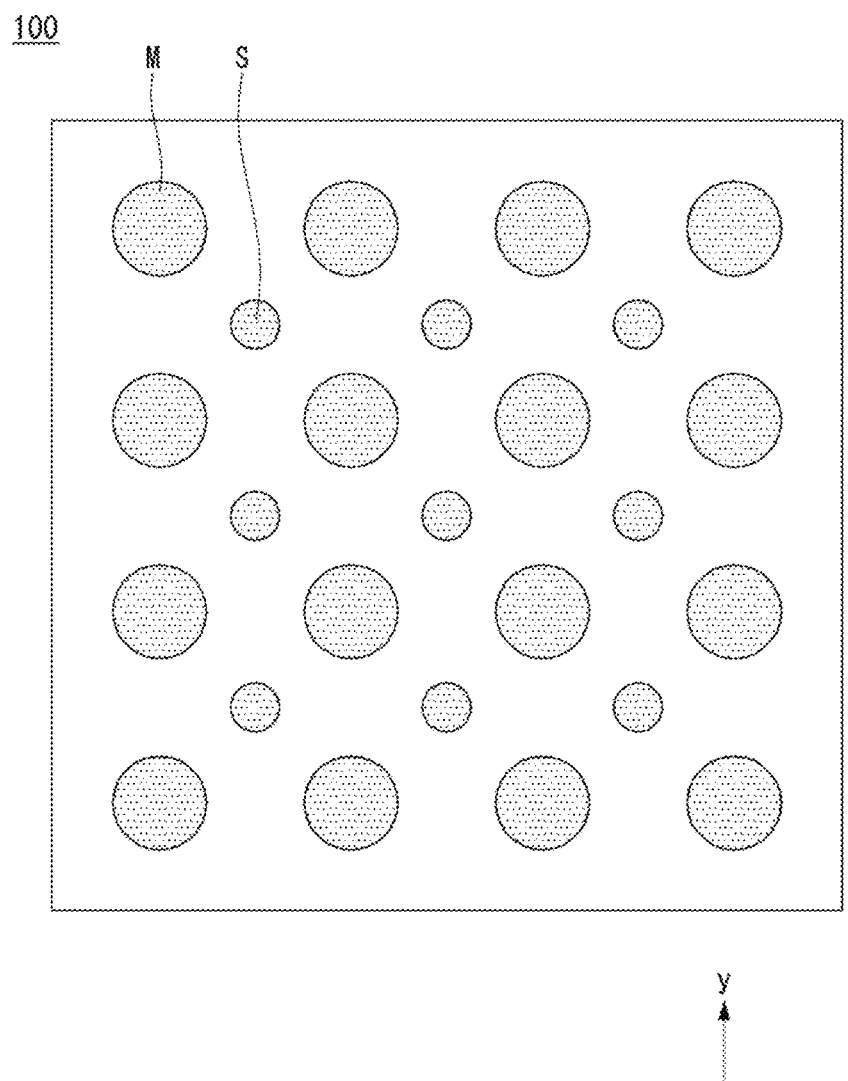

[Figure 20]
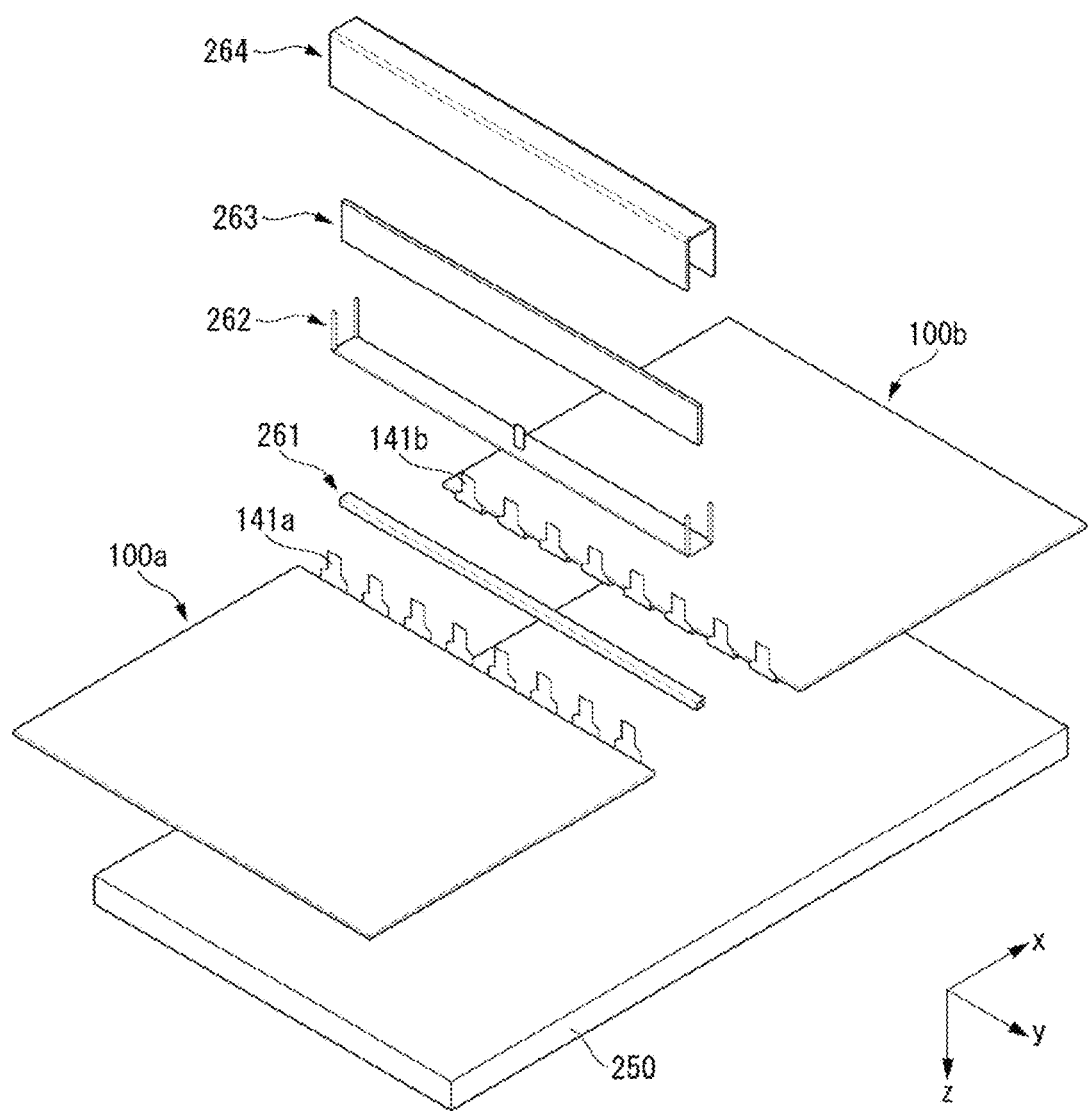

【Figure 21】
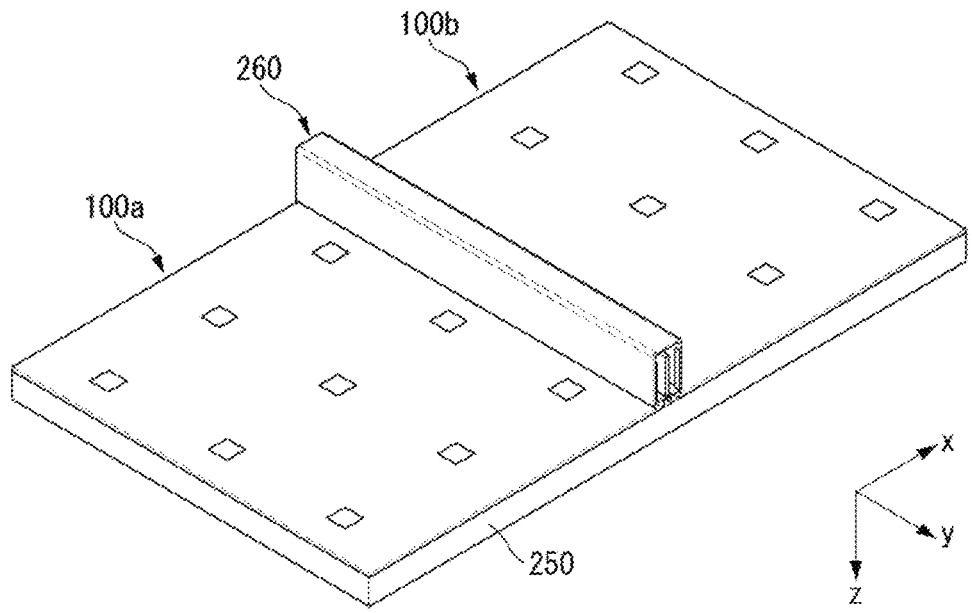
【Figure 22】
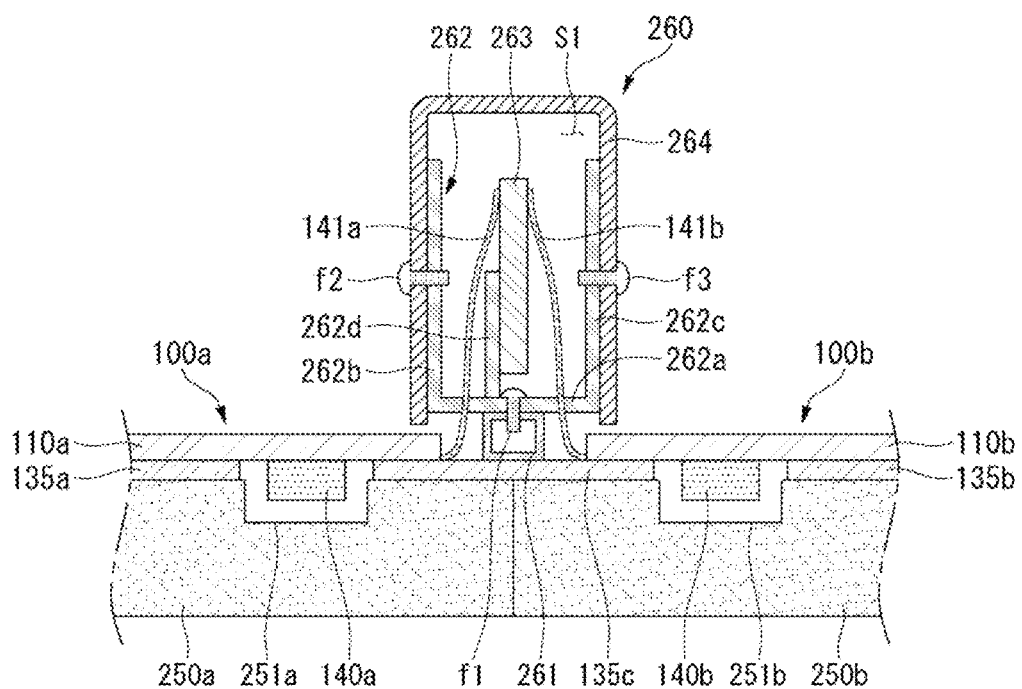

DISPLAY DEVICE WITH A BEZEL KIT

CROSS-REFERENCE TO RELATED APPLICATIONS

This application is the National Stage filing under 35 U.S.C. 371 of International Application No. PCT/KR2018/002332, filed on Feb. 26, 2018, which claims the benefit of earlier filing date and right of priority to Korean Application No. 10-2017-0123632, filed on Sep. 25, 2017, the contents of which are all hereby incorporated by reference herein in their entirety.

TECHNICAL FIELD

The present disclosure relates to a display device.

BACKGROUND ART

Digital signage as a communication tool which advertisers can use for marketing, advertisements, training, etc., and induce customer experiences is a digital imaging device that provides not only common broadcast contents in public places such as airports, hotels, hospitals, etc., but also advertising contents intended by advertisers. Since the digital signage has a processor and a memory built therein and can freely move and can freely express various contents, the digital signage can be used for various purposes including promotional, customer service, information media purposes, etc., in department stores, subways, bus stops, etc. Further, only the advertising contents are not particularly provided through the digital signage but various contents having purposes other than the advertisement can be provided.

The digital signage generally adopts a plurality of LEDs. Since the LED has a long lifespan and high luminous efficiency, the LED can be used as a replacement of fluorescent and incandescent lamps in the related art. Further, since the LED is smaller than a light source in the related art, the LED is more spotlighted as a lighting device.

DISCLOSURE

Technical Problem

An embodiment of the present disclosure may provide a display device in which a display film is attached to a plate.

Another embodiment of the present disclosure may provide a display device which includes a hole on a front surface of the plate to implement a light diffusion effect.

Yet another embodiment of the present disclosure may provide a display device which includes the hole on a rear surface of the plate to implement the light diffusion effect.

Still yet another embodiment of the present disclosure may provide a display device which implements the light diffusion effect by processing a circumference surface of the hole.

Still yet another embodiment of the present disclosure may provide a display device having a structure in which a plurality of display films is connected.

Technical Solution

According to an embodiment of the present disclosure, a display device includes: a light transmissive plate including a first front surface, a rear surface facing the first front surface, and a hole positioned behind the first front surface and connected to the rear surface; and a display film attached to the rear surface of the plate, in which the display film may include a light transmissive substrate having a second front surface attached to the plate, an electrode layer formed on the second front surface, and a light source electrically connected to the electrode layer, and the light source may be positioned in the hole.

A haze value of a circumference surface of the hole may be 2 to 50%.

The display device may further include an adhesive layer formed on the rear surface of the plate.

The display device may further include a second hole formed on a front surface of the plate.

The display device may further include a third hole formed on the rear surface of the plate and the third hole may be spaced apart from the hole.

The third hole may be positioned behind the first front surface and may be hollow.

At least any one of the second hole or the third hole may have a notch shape.

The plate may include a glass or acrylic material.

The display device may further include: a second display film attached to the rear surface of the plate; and a bezel kit attached to the rear surface of the plate and connecting the display film and the second display film.

The bezel kit may include a bar attached to the rear surface of the plate and is positioned between the display film and the second display film.

The bar may have a hollow shape.

The bezel kit may include a bottom including a first part fastened to the bar and a second part extending to a rear side from the first part, and a control board fixed to the second part.

The display device may further include: a first FPCB connecting the control board and the display film, and a second FPCB connecting the control board and the second display film.

The bezel kit may include a cover covering the bar, the bottom, the first FPCB, and the second FPCB.

The bottom may include a third part which extends to the rear side from the first part and is spaced apart from the second part, and include a fastening member passing through the cover and the third part.

Advantageous Effects

According to at least one of embodiments of the present disclosure, a display device in which a display film is attached to a plate can be implemented.

According to at least one of embodiments of the present disclosure, a hole is included on a front surface of the plate to implement a light diffusion effect.

According to at least one of embodiments of the present disclosure, the hole is included on a rear surface of the plate to implement the light diffusion effect.

According to at least one of embodiments of the present disclosure, a circumference surface of the hole is machined to implement the light diffusion effect.

According to at least one of embodiments of the present disclosure, a plurality of display films can be connected.

An additional range of an applicability of the present disclosure will be apparent from the following detailed description. However, since various changes and modifications can be clearly appreciated by those skilled in the art within the spirit and the scope of the present disclosure, the detailed description and a specific embodiment such as a preferred embodiment of the present disclosure should be appreciated as being just given as an example.

DESCRIPTION OF DRAWINGS

FIGS. 1 to 8 are diagrams illustrating a display device according to an embodiment of the present disclosure.

FIGS. 9 to 22 are diagrams illustrating a configuration of a display device according to an embodiment of the present disclosure.

MODE FOR INVENTION

Hereinafter, embodiments disclosed in the present disclosure will be described in detail with reference to the accompanying drawings and the same or similar components are denoted by the same reference numerals regardless of a sign of the drawing, and duplicated description thereof will be omitted. Suffixes "module" and "unit" for components used in the following description are given or mixed in consideration of easy preparation of the specification only and do not have their own distinguished meanings or roles.

In describing the components of the embodiments of the present disclosure, terms including first, second, A, B, (a), (b), upper, lower, and the like may be used. These terms are just intended to distinguish the components from other components, and the terms do not limit the nature, sequence, or order of the components.

Further, when it is disclosed that any component is "connected", "coupled", or "linked" to other components, it should be understood that the component may be directly connected or linked to other components, but another component may be "connected", "coupled", or "linked" between the respective components.

Further, in describing the embodiment of the present disclosure, a detailed description of related known technologies will be omitted if it is determined that the detailed description makes the gist of the embodiment disclosed in the present disclosure unclear. Further, it is to be understood that the accompanying drawings are just used for easily understanding the embodiments disclosed in the present disclosure and a technical spirit disclosed in the present disclosure is not limited by the accompanying drawings and all changes, equivalents, or substitutes included in the spirit and the technical scope of the present disclosure are included.

Hereinafter, a +x-axis direction may be referred to as a right direction. An x-axis direction may be referred to as a left direction. A +y-axis direction may be referred to as an upper direction. A −y-axis direction may be referred to as a lower direction. A +z-axis direction may be referred to as a forward direction or a front. A −z-axis direction may be referred to as a backward direction or a rear.

Referring to FIG. 1, a display film 100 may include a base 110. The base 110 may be referred to as a substrate. Alternatively, the base 110 may be referred to as a plate. The base 110 may be a transparent material. Alternatively, the base 110 may have light transmittance. A thickness of the base 110 may be formed very thin. For example, the thickness of the base 110 may be, for example, 250 μm.

The base 110 may have an insulating property. Power supplied to the display film 100 may be cut off without passing through the base 110.

In the process of producing the display film 100, heat may be applied to the base 110. For example, the base 110 may include a Polyethylene Terephthalate (PET) material. When the thickness of the base 110 is sufficiently thick, the base 110 may be prevented from being thermally deformed even though heat of 200 degrees or more is applied to the base 110 in the process of producing the display film 100.

Referring to FIG. 2, an electrode layer 120 may be formed on the base 110. The electrode layer 120 may have conductivity. The electrode layer 120 may serve as a passage for transferring power supplied from a power supply. Further, the electrode layer 120 may serve as a passage for transferring a control signal transmitted from a control device.

The electrode layer 120 may be coated on the base 110. Further, the electrode layer 120 may be coated on the base 110 with a very small thickness. The electrode layer 120 may have the light transmittance due to a thin thickness. Accordingly, even though the electrode layer 120 is coated on the base 110, the display film 100 may have the light transmittance.

The electrode layer 120 may include a metal nano wire. For example, the electrode layer 120 may include an Ag nano wire. The Ag nano wire may have high conductivity and excellent light transmittance.

Referring to FIG. 3, the electrode layer 120 may form a pattern. The pattern of the electrode layer 120 may serve as a wire structure.

The pattern of the electrode layer 120 may be formed through an additional process after the electrode layer 120 is coated on the base 110. For example, the pattern of the electrode layer 120 may be formed by irradiating a laser to the electrode layer 120 coated on the base 110. Alternatively, the pattern of the electrode layer 120 may be formed by etching the electrode layer 120 coated on the base 110.

Referring to FIG. 4, the display film 100 may include a light source assembly 140. The light source assembly 140 may be installed in the base 110. Further, the light source assembly 140 may be electrically connected to the electrode layer 120.

The electrode layer 120 may include a positive electrode 122 and a negative electrode 124. The positive electrode 122 may be referred to as a positive pole, an oxidation electrode, or an anode. The negative electrode 124 may be referred to as a negative pole, a reduction electrode, or a cathode.

The light source assembly 140 may be installed in plural. A plurality of light source assemblies 140 may be disposed along one side of the base 110 and may form one row. The row may be referred to as a row. The plurality of light source assemblies 140 forming one row may be spaced apart from each other. Alternatively, the plurality of light source assemblies 140 forming one row may be disposed at an equal interval.

Rows R1, R2, R3, R4, R5, and R6 formed by the plurality of light source assemblies 140 may be formed in plural. Respective rows R1, R2, R3, R4, R5, and R6 may be disposed along one side of the base 110. Further, the respective rows R1, R2, R3, R4, R5, and R6 may be spaced apart from each other. Alternatively, the respective rows R1, R2, R3, R4, R5, and R6 may be disposed at an equal interval.

The positive electrode 122 may elongate along one row. The positive electrode 122 may be electrically connected to each of the plurality of light source assemblies 140 of one row. The positive electrode 122 may be positioned above one row.

The negative electrode 124 may elongate along one row. The negative electrode 124 may be electrically connected to each of the plurality of light source assemblies 140 of one row. The negative electrode 124 may be positioned below one row. In other words, one row may be positioned between the positive electrode 122 and the negative electrode 124.

The positive electrode 122 connected to one row may be formed by one electrode. The plurality of light source assemblies 140 of one row may be connected to one positive electrode 122. The negative electrode 124 connected to one row may be formed in plural. The negative electrode 124 may be formed to correspond to each of the plurality of light source assemblies 140 of one row.

Referring to FIG. 5, the positive electrode 122 may be disposed between a first row R1 and a second row R2. Alternatively, the positive electrode 122 may be disposed between a third row R3 and a fourth row R4. Alternatively, the positive electrode 122 may be disposed between a fifth row R5 and a sixth row R6. Alternatively, the positive electrode 122 may be disposed between a seventh row R7 and an eighth row R8.

Each of the plurality of light source assemblies 140 of the first row R1 may be electrically connected to one positive electrode 122 disposed between the first row R1 and the second row R2. Each of the plurality of light source assemblies 140 of the second row R2 may be electrically connected to one positive electrode 122 disposed between the first row R1 and the second row R2.

The negative electrode 124 electrically connected to the first row R1 may be disposed above the first row R1. The negative electrode 124 may be formed to correspond to each of the plurality of light source assemblies 140 of the first row R1.

The negative electrode 124 electrically connected to the second row R2 may be disposed below the second row R2. The negative electrode 124 may be formed to correspond to each of the plurality of light source assemblies 140 of the second row R2.

A connection structure of the positive electrode 122 electrically connected to the third row R3 and the fourth R4, the negative electrode 124 electrically connected to the third row R3, the positive electrode 122 electrically connected to the fourth row R4, and the negative electrode 124 electrically connected to the fourth row R4 may be the same as the connection structure of the first row R1, the second row R2, the positive electrode 122, and the negative electrode 124 described above.

The connection structure of the fifth row R5 and the sixth row R6 and the connection structure of the seventh row R7 and the eighth row R8 may also be the same as the connection structure of the first row R1 and the second row R2.

Referring to FIG. 6, the light source assembly 140 may include a plurality of LED chips 140a, 140b, and 140c. For example, the light source assembly 140 may include a red LED chip 140a, a green LED chip 140b, and a blue LED chip 140c.

Each of the plurality of light source assemblies 140 may be electrically connected to one positive electrode 122. The negative electrodes 124 connected to the respective light source assemblies 140 may be independent from each other. Further, the negative electrode 124 electrically connected to each assembly may include three electrodes. Three electrodes may be electrically connected to the red LED chip 140a, the green LED chip 140b, and the blue LED chip 140c, respectively. As a result, the LED chips 140a, 140b, and 140c of the light source assembly 140 may be individually controlled.

Referring to FIGS. 7 and 8, the light source assembly 140 may include a plurality of LED chips 140a, 140b, and 140c and an IC chip 140d. The electrode layer 120 may include a positive electrode 122, a negative electrode 124, and a control electrode 125. The positive electrode 122 may be referred to as an electrode. Alternatively, the negative electrode 124 may be referred to as the electrode. Alternatively, the control electrode 125 may be referred to as the electrode. Alternatively, the control electrode 125 may be referred to as a switching electrode.

The control electrode 125 may electrically connect light source assemblies 140 adjacent to each other. Further, the control electrode 125 may connect the light source assemblies 140 adjacent to each other in series. The control electrode 125 may transfer a signal for controlling the IC chip 140d of the light source assembly 140.

Each of the plurality of light source assemblies 140 may be electrically connected to one positive electrode 122. The negative electrodes 124 connected to the respective light source assemblies 140 may be independent from each other. Further, the negative electrodes 124 connected to the respective light source assemblies 140 may be one electrode. Even though the positive electrode 124 is not connected to each of the plurality of LED chips 140a, 140b, and 140c included in the light source assembly 140, the plurality of LED chips 140a, 140b, and 140c may be individually controlled through the IC chip 140d.

Current supplied through the power supply may flow in the order of the positive electrode 122, the plurality of LED chips 140a, 140b, and 140c, the IC chip 140d, and the negative electrode 124. Alternatively, the current supplied through the power supply may flow in the order of the positive electrode 122, the IC chip 140d, the plurality of LED chips 140a, 140b, and 140c, and the negative electrode 124.

Referring to FIGS. 9 and 10, the display film 100 may be attached to a plate 250. The plate 250 may include a light transmissive material. For example, the plate 250 may include a glass or acrylic material. The plate 250 may be used as a glass window. The plate 250 may be attached to the glass window. The plate 250 may be referred to as an attached surface or a light transmissive plate.

The plate 250 may have a plurality of holes 251. The hole 251 may be connected to a rear surface of the plate 250. The hole 251 may be positioned behind a front surface of the plate 250. A light source 140 may be positioned in the hole 251.

An adhesive layer 135 may be formed on the rear surface of the plate 250. The adhesive layer 135 may attach the display film 100 to the plate 250.

A metallic pad 130 may be positioned on the electrode layer 120. The light source 140 may be positioned on the metallic pad 130.

A height H1 from the base 110 up to the hole 251 may be larger than a height H2 from the base 110 up to the light source 140. A width W2 of the hole 251 may be larger than a width W1 of the light source 140.

Referring to FIG. 9 and FIGS. 11 to 14, circumferential surfaces of holes 251, 251a, and 251b may be roughened. Roughness of the circumferential surfaces of the holes 251, 251a, and 251b is adjusted to adjust a degree at which light emitted from the light source 140 is diffused. When machining the circumferential surfaces of the holes 251, 251a, and 251b, a quantitative value may be defined as a haze value.

When the light emitted from the light source is incident on a sample, the incident light may be divided into reflected light and transmitted light. Light passing through the sample may be divided into light straightly passing through the sample and diffused or scattered light. The haze value may be a value represented as a value representing a ratio of the light straightly passing through the sample to the light passing through the sample among the light emitted from the light source by a % value.

The circumferential surfaces of the holes 251, 251a, and 251b may be machined to have a haze value of 2 to 50%. Surface machining of the circumferential surfaces of the holes 251, 251a, and 251b may be formed by sanding machining.

A first hole 251 may have a smooth circumferential surface. The circumferential surface of a third hole 251b may have a smaller haze value than the circumferential surface of a second hole 251a. In other words, the circumferential surface of the third hole 251b may have a rougher circumferential surface than the second hole 251a.

Light passing through the second hole 251a may be more diffused than light passing through the first hole 251. Light passing through the third hole 251b may be more diffused than the light passing through the second hole 251a.

The smaller the haze value, the higher a viewing angle. Theta 2 may have a larger value than theta 1. Theta 3 may have a larger value than theta 2.

The light passing through the second hole 251a may have a higher viewing angle than the light passing through the first hole 251. The light passing through the third hole 251b may have a higher viewing angle than the light passing through the second hole 251a.

Referring to FIGS. 15, 16, and 19, the plate 250 may include a hole 252 on the front surface thereof. The hole 252 may be a notch. The hole 252 may be in communication with the outside. The interior of the hole 252 may be en empty space.

The light emitted from the light source 140 may include light A emitted to the outside by passing through the plate 250.

The light emitted from the light source 140 may include light C emitted to the outside by passing through the plate 250 and the hole 252.

The light emitted from the light source 140 may include light F totally reflected on a boundary surface with the plate 250. Alternatively, the light emitted from the light source 140 may include light F totally reflected on the front surface of the plate 250.

The light F totally reflected on the external boundary surface with the plate 250 may be totally reflected on a boundary between the plate 250 and the adhesive layer 135. Alternatively, the light F totally reflected on the external boundary surface with the plate 250 may be totally reflected on the rear surface of the plate 250.

Light G totally reflected on the boundary surface between the plate 250 and the adhesive layer 135 may be incident on the hole 252. Alternatively, light G totally reflected on the rear surface of the plate 250 may be incident on the hole 252. The light incident on the hole 252 may include light B emitted to the outside by passing through the plate 252.

When the hole 252 is viewed from the outside, it may be seen that the light is emitted from the hole 252. The hole 252 may serve as a virtual light source. Luminance of a region M adjacent to the light source 140 may be greater than the luminance of a region S adjacent to the hole 252.

Referring to FIGS. 17, 18, and 19, the plate 250 may include a hole 253 on the rear surface thereof. The hole 253 may be the notch. The hole 253 may face the adhesive layer 135. The interior of the hole 253 may be the empty space.

The light emitted from the light source 140 may include the light A emitted to the outside by passing through the plate 250.

The light emitted from the light source 140 may include light H reflected on the boundary surface between the plate 250 and the hole 253.

The light H reflected on the boundary surface between the plate 250 and the hole 253 may include light D emitted to the outside by passing through the plate 250.

The light emitted from the light source 140 may include light I passing through the hole 253.

The light I passing through the hole 253 may include light E emitted to the outside by passing through the plate 250.

When the hole 253 is viewed from the outside, it may be seen that the light is emitted from the hole 253. The hole 253 may serve as the virtual light source. The luminance of the region M adjacent to the light source 140 may be greater than the luminance of the region S adjacent to the hole 252.

Referring to FIGS. 20 to 22, a first display film 100a and a second display film 100b may be attached to the plate 250. A first adhesive layer 135a, a second adhesive layer 135b, and a third adhesive layer 135c may be formed on the rear surface of the plate 250. The first display film 100a may be attached to the plate 250 through the first and third adhesive layers 135a and 135c. The second display film 100b may be attached to the plate 250 through the second and third adhesive layers 135b and 135c.

A first FPCB 141a of the first display film 100a and a second FPCB 141b of the second display film 100b may be connected to each other through a bezel kit 260.

The first FPCB 141a may be connected to a first light source 140a or a first base 110a of the first display film 100a. The second FPCB 141b may be connected to a second light source 140b or a second base 110b of the second display film 100b.

A bar 261 may be attached to the rear surface of the plate 250. The bar 261 may be positioned between the first display film 100a and the second display film 100b. The bar 261 may be attached to the plate 250 through the adhesive layer 135c. The bar 261 may have a hollow shape.

A bottom 262 may be fastened to the bar 261. A first part 262a may be fastened to the bar 261 through a fastening member f1. A second part 262b may be fastened to a cover 264 through a fastening member f2. A third part 262c may be fastened to the cover 264 through a fastening member f3. A fourth part 262d may be fastened to a control board 263 through a fastening member (not illustrated). The fourth part 262d may be positioned between the second part 262b and the third part 262c.

The control board 263 may be connected to the first FPCB 141a of the first display film 100a. The first FPCB 141a may be connected to the control board 263 by passing through a hole (not illustrated) of the first part 262a. The control board 263 may be connected to the second FPCB 141b of the second display film 100b. The second FPCB 141b may be connected to the control board 263 by passing through a hole (not illustrated) of the first part 262a.

The cover 264 may be fastened to the bottom 262. The cover 264 may provide an internal space S1. The cover 264 may accommodate the bottom 262, the control board 263, the first FPCB 141a, the second FPCB 141b, or the bar 261.

When the plate 250 is sufficiently large, a plurality of display films may be attached. A plurality of bezel kits may be formed in order to connect to the plurality of display films. A length of the bezel kit may be sufficiently large in order to connect to the plurality of display films.

The plate may be provided in plural. The plurality of display films may be attached to each plate. The first display film 100a may be attached to the rear surface of the first plate 250a. The second display film 100b may be attached to the rear surface of the second plate 250b. The first plate 250a and the second plate 250b may be connected to each other. The first display film 100a and the second display film 100b may be connected to each other.

The embodiments of the present disclosure described above are not mutually exclusive or distinct from each other. Respective components or functions of the embodiments of the present disclosure described above may be jointly used or combined with each other.

The aforementioned detailed description should not be construed as restrictive in all terms and should be exemplarily considered. The scope of the present disclosure should be determined by rational construing of the appended claims and all modifications within an equivalent scope of the present disclosure are included in the scope of the present disclosure.

The invention claimed is:

1. A display device comprising:
   a light transmissive plate including a first front surface and a rear surface opposite the front surface;
   a first display film attached to the rear surface of the light transmissive plate;
   a second display film attached to the rear surface of the light transmissive plate; and
   a bezel kit attached to the rear surface of the light transmissive plate and connecting the first display film and the second display film,
   wherein the first and second display films each include:
   a light transmissive substrate having a second front surface attached to the light transmissive plate,
   an electrode layer formed on the second front surface, and
   a light source electrically connected to the electrode layer.

2. The display device of claim 1, wherein the light transmissive plate includes:
   a hole formed at the rear surface in which the light source is positioned; and
   a second hole formed at the first front surface of the light transmissive plate and laterally spaced apart from a position corresponding to the hole,
   wherein light emitted by the light source is transmitted outwardly through the second hole or a third hole formed at the rear surface of the light transmissive plate,
   wherein the third hole is laterally spaced apart from the hole and configured to reflect light emitted by the light source toward the first front surface, and
   wherein a haze value of a circumference surface of the hole is 2 to 50%.

3. The display device of claim 2, wherein at least any one of the second hole or the third hole has a notch shape.

4. The display device of claim 2, wherein the light transmitted through the second hole provides an appearance of a virtual light source at the second hole.

5. The display device of claim 2, wherein the light reflected toward the first front surface provides an appearance of a virtual light source at the third hole.

6. The display device of claim 1, further comprising:
   an adhesive layer formed on the rear surface of the light transmissive plate.

7. The display device of claim 1, wherein the plate includes a glass or acrylic material.

8. The display device of claim 1, wherein the bezel kit includes a bar attached to the rear surface of the light transmissive plate and is positioned between the first display film and the second display film.

9. The display device of claim 8, wherein the bar has a hollow shape.

10. The display device of claim 9, wherein the bezel kit includes
    a bottom including a first part fastened to the bar and a second part extending to a rear side from the first part, and
    a control board fixed to the second part.

11. The display device of claim 10, wherein a first flexible printed circuit board (FPCB) connecting the control board and the first display film, and
    a second FPCB connecting the control board and the second display film.

12. The display device of claim 11, wherein the bezel kit includes a cover covering the bar, the bottom, the first FPCB, and the second FPCB.

13. The display device of claim 12, wherein the bottom includes a third part which extends to the rear side from the first part and is spaced apart from the second part, and includes a fastening member passing through the cover and the third part.

* * * * *